United States Patent
Heizmann et al.

(10) Patent No.: US 6,778,118 B2
(45) Date of Patent: Aug. 17, 2004

(54) THERMOMETER CODE DIGITAL TO AUDIO CONVERTER

(75) Inventors: Friedrich Heizmann, Villingen-Schwenningen (DE); Maximilian Erbar, Mühlheim-Kärlich (DE)

(73) Assignee: Thomson Licensing S.A., Cedex (FR)

( * ) Notice: Subject to any disclaimer, the term of this patent is extended or adjusted under 35 U.S.C. 154(b) by 0 days.

(21) Appl. No.: 10/428,620

(22) Filed: May 2, 2003

(65) Prior Publication Data

US 2004/0017304 A1 Jan. 29, 2004

(30) Foreign Application Priority Data

May 3, 2002 (EP) .............................. 02009951

(51) Int. Cl.[7] .............................................. H03M 1/66
(52) U.S. Cl. ...................... 341/144; 341/145; 341/143
(58) Field of Search ................................ 341/144, 145, 341/118, 120, 143

(56) References Cited

U.S. PATENT DOCUMENTS

| 5,404,142 | A | | 4/1995 | Adams et al. .............. 341/144 |
|---|---|---|---|---|
| 6,163,283 | A | | 12/2000 | Schofield ..................... 341/50 |
| 6,218,977 | B1 | * | 4/2001 | Friend et al. ............... 341/163 |
| 6,225,929 | B1 | | 5/2001 | Beck ........................... 341/144 |
| 6,359,467 | B1 | | 3/2002 | McCarroll .................... 326/37 |
| 6,614,377 | B1 | * | 9/2003 | Adams et al. .............. 341/144 |

FOREIGN PATENT DOCUMENTS

JP          02020934          1/1990          ........... H04B/14/04

OTHER PUBLICATIONS

Search Report.

* cited by examiner

Primary Examiner—Brian Young
Assistant Examiner—John B Nguyen
(74) Attorney, Agent, or Firm—Joseph S. Tripoli; Joseph J. Opalach

(57) ABSTRACT

The invention relates to a method for converting a digital signal an analogue signal and to a digital to analogue converter comprising means for converting a digital signal to a thermometer coded signal, means for randomizing the thermometer coded signal, means for controlling the means for randomizing based on the digital signal and means for converting the randomized signal to analogue.

10 Claims, 5 Drawing Sheets

THERMOMETER CODE DIGITAL TO AUDIO CONVERTER

This application claims the benefit under 35 U.S.C. 119(a) of European patent application No. 200951.1 filed May 3, 2002.

1. Field of the Invention

The present invention generally refers to the field of digital to analogue conversion, and more particularly to thermometer code based digital to audio conversion.

2. Background and Prior Art

Thermometer code digital to audio converters DACs are as such known from the prior art. Conventional thermometer codes DACs are of the so-called current-steering type. For converting of an m-bit digital input signal a conventional DAC of the current-steering type includes a plurality of n identical current sources, where $n=2^m-1$. Each of the current sources passes a substantially constant current I.

Each of the current sources is switchable in order to perform the digital to analogue conversion. In such a conventional DAC the switching of the current sources I is controlled by thermometer-coded signals. For an overview of the respective prior art reference is made to U.S. Pat. No. 6,163,283.

U.S. Pat. No. 6,359,467 shows a DAC which converts a randomised digital code into an analogue signal. The randomisation is performed by a current-mode randomiser which randomises a digital code based on a control word provided by a pseudo random number generator.

U.S. Pat. No. 6,225,929 shows a DAC having switchable current sources and a resistor string. The resistor string includes N resistors serially coupled between a ground node and the analogue voltage output signal. Nodes 1 through N−1 are defined at junctions between the N resistors and a node N is coupled to the analogue voltage output signal. Each of N switchable current sources is controlled by a corresponding one of the N bits of the digital input signal to supply current to a corresponding one of the N nodes when its corresponding one of the N bits is in the first state and to not supply current to its corresponding one of the N nodes when its corresponding one of the N bits is in the second state. The DAC includes thermometer converting logic for controlling each switchable current source.

In general each current source is enabled for a different amount of time and that mismatches between the implemented currents have an increased effect.

SUMMARY OF THE INVENTION

It is an object of the present invention to provide an improved method for digital to analogue conversion and an improved DAC, in particular for audio applications.

The object of the present invention is solved basically by applying the features laid down in the independent claims. Preferred embodiments of the invention are given in the dependent claims.

The invention provides for an efficient method and apparatus to reduce the effects of current source mismatch on signal distortion in the digital to analogue conversion process. In essence, this is accomplished by controlling the operation of the randomiser based on the digital signal to be converted itself.

In accordance with a preferred embodiment of the invention the randomiser comprises a barrel shifter for randomisation of the thermometer-coded signal. Preferably the barrel shifter is controlled by means of a signal that is derived from the digital signal to be converted.

In accordance with a further preferred embodiment of the invention the digital signal to be converted has a width of mbits. A modulo n of the digital signal is determined, where $n=2^m-1$. The modulo n of the digital signal can be used as a control signal for the barrel shifter.

In accordance with a further preferred embodiment of the invention a noise shaper is used to shift quantization noise to higher frequencies. The output of the noise shaper is converted to a thermometer-coded signal. The operation of the randomiser is controlled by the output signal of the noise shaper. This has the advantage that the quantization noise is not shifted back into the audible spectrum as this can be the case in prior art randomisers.

In accordance with a further preferred embodiment of the invention the noise shaper has a control circuit for resetting the noise shaper when the input signal remains at a predetermined signal level for a predetermined period of time in order to suppress undesired signal output of the noise shaper during pauses, in particular for audio applications.

The present invention is particularly advantageous in that it enables to substantially reduce the signal distortion of a DAC which are caused by tolerances of the current sources. Further the present invention enables to eliminate audible noise which is produced during pauses. This way the audio quality is substantially improved.

BRIEF DESCRIPTION OF THE DRAWINGS

The invention will be described in greater detail by making reference to the drawings in which.

DETAILED DESCRIPTION

Figure 1:
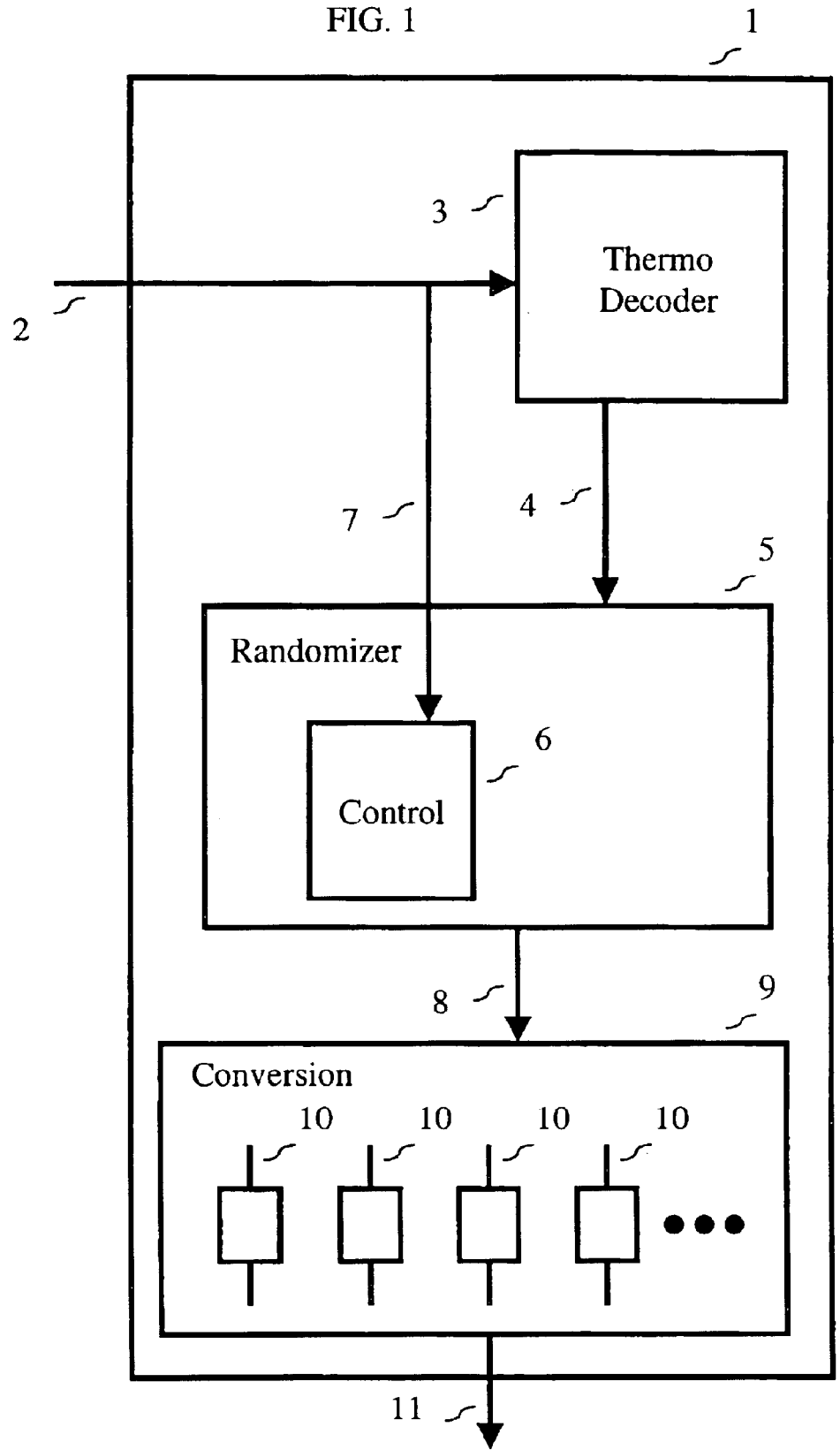
FIG. 1 is a block diagram of an embodiment of a DAC in accordance with the present invention.

FIG. 1 shows a block diagram of a digital to audio converter DAC 1. The DAC 1 has an input 2 for receiving a digital signal. The input 2 is coupled to the input of thermo decoder 3 which serves to convert a signal applied at the input 2 to a thermometer coded signal. The output 4 of the thermo decoder 3 is coupled to the input of randomiser 5.

Randomiser 5 has a control module 6 for controlling the internal operation of the randomiser. The control module 6 has a control input 7 which is coupled to the input 2.

The output 8 of the randomiser 5 is coupled to the conversion module 9 which has a number of n current sources 10.

The current sources 10 are switchable in order to convert the signal applied from the output 8 to analogue. This corresponds to the operation of digital to analogue conversion of the so-called "current-steering" type.

The result of the digital to analogue conversion is outputted at the output 11 of the module 9.

In operation a digital signal is applied at the input 2 of the DAC 1. The signal is inputted into the thermo decoder 3 in order to convert the signal to a thermometer coded signal.

The digital input signal is also provided to the control module 6 as a control signal. The control module 6 controls the operation of the randomiser as far as the randomisation of the thermometer coded signal provided via output 4 is concerned based on the signal applied at its control input 7 which is identical to the input signal at input 2.

Hence, the result of the randomisation of the thermometer coded signal depends on the input signal at input 2 itself. The randomised thermometer coded signal at output 8 is then used in order to switch the current sources 10 for the digital to analogue conversion.

Figure 2:
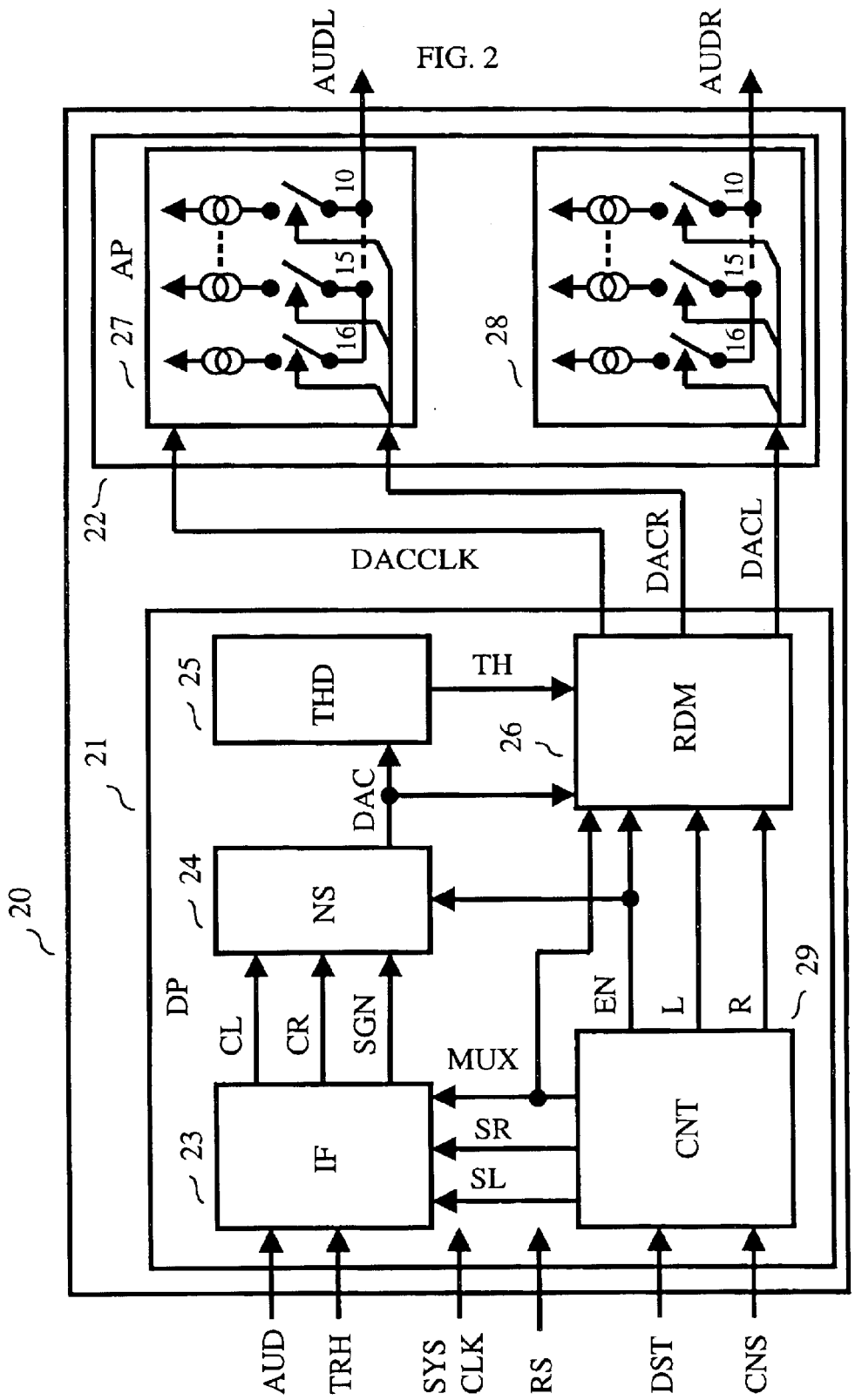
FIG. 2 is a block diagram of a Sigma-Delta digital to analogue converter.

The control of the randomisation process by the input signal itself has the effect that tolerances of the current sources are averaged out in the digital to analogue conversion process. Another advantage is that quantization noise which has been shifted to higher frequencies by a noise shaper is not shifted back to audible frequencies by the randomisation as it can be the case in prior art DACs. This will be further explained by making reference to FIGS. 2 to 5:

FIG. 2 shows a block diagram of a Sigma-Delta multi-bit audio digital to analogue converter DAC 20.

The DAC 20 comprises a digital circuit 21 and an analogue circuit 22 at the output stage.

The digital circuit 21 has an interface module (IF) 23 for receiving a digital audio signal AUD. For example the digital audio signal is a stereo signal containing left and right channel data samples in alternating order. Each of the data samples has a width of 16 bits.

Further the interface module 23 has a control input for inputting a time threshold signal TRH. For example, the time threshold signal TRH has a width of 6 bits. By means of the signal TRH it is possible to program an initial counter value of a timer contained in the interface module 23.

One of the purposes of the interface module 23 is to oversample the digital audio signal AUD in order to provide the signal SGN at its output. Typically the frequency of the signal AUD is 16 fs, i.e. 16 times the sample frequency. Such a signal is provided for the audio processing part in a CD chip.

The signal SGN produced by the interface module 23 is an interleaved data stream of 256 fs. Furthermore the interface module 23 serves to produce a reset or a clear signal CL for the left channel and the reset or clear signal CR for the right audio channel. The signal CL is outputted by the interface module 23 if there is silence on the left audio channel for a predetermined period of time; this predetermined period of time is programmable by means of the signal TRH. Likewise the signal CR is outputted by the interface module 23, when there is silence on the right audio channel for the predetermined period of time.

The signals CL, CR and SGN are inputted into noise shaper module 24. The noise shaper module 24 comprises a second order Sigma-Delta modulator to produce the output signal DAC comprising data samples of a smaller width but higher bit rate. This way quantization noise is shifted to higher frequencies.

The signal DAC is inputted into thermometer decoder module 25 and into randomiser module 26.

The thermometer decoder module 25 produces a thermometer code output signal TH which is inputted into the randomiser module 26. The thermometer code has a width of n bits, if there are n current sources in the analogue circuit 22 as will be explained below in greater detail. Hence, in the example considered here the thermometer code has seven bits.

The randomiser module 26 serves to modify the distribution of 0 and 1 in a given thermometer code sample of the signal TH in order to reduce the errors which are caused by tolerances of the current sources within the analogue circuit 22.

The analogue circuit 22 has a conversion module 27 for the left audio channel and a conversion module 28 for the right audio channel. Both the conversion module 27 and 28 have a number of n current sources, where n=7 in the example considered here. The current sources are switched by means of the randomised right channel output signals DACR and the randomised left channel output signals DACL of the randomiser module 26 in order to produce analogue left channel audio output signals AUDL and right channel analogue output audio signals AUDR.

Further the Sigma-Delta DAC 20 has a control module CNT 29 for receiving a data strobe DST and a channel select CNS signal. Further the Sigma-Delta DAC 20 receives a system clock SYSCLK and has a reset input RS.

The control module 29 serves to generate the signals store_left SL and store_right SR as well as the multiplexing signal MUX to control the operation of the interface module 23. The signal SL indicates to the interface module 23 when there is a valid left channel audio sample in the input stream AUD. Likewise the signal SR indicates when there is a valid right channel sample. The signal MUX serves to control a multiplexer within the interface module 23 in order to oversample the signal AUD.

Further the control module 29 serves to produce the enable signal EN and left and right channel control signals L and R for the randomiser module 26.

Figure 3:
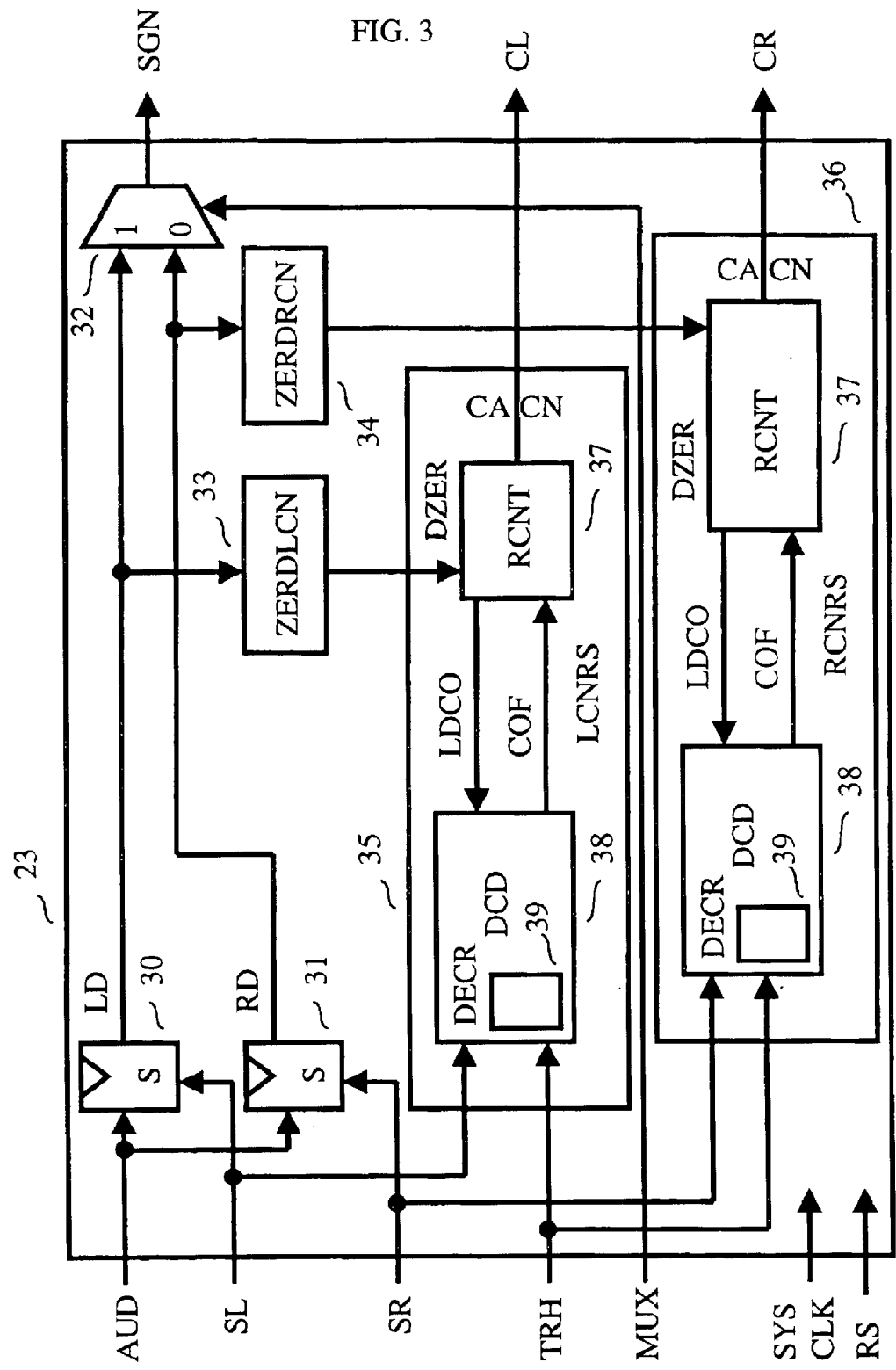
FIG. 3 is a block diagram of an electronic circuit for controlling the noise shaper filter of the Sigma-Delta digital to analogue converter of FIG. 2.

FIG. 3 shows the structure of the interface module 23 in greater detail. The interface module 23 contains registers 30 and 31 for receiving the signal AUD. The enable inputs S of the registers 30 and 31 are coupled to the signals SL and SR, respectively.

The left channel output left_data LD of the register 30 and the right channel output signal right_data RD of the register 31 are inputted into multiplexer 32 which produces the output SGN. The operation of the multiplexer 32 is controlled by the signal MUX.

A zero detector 32 for the left channel and a zero detector 34 for the right channel ZERDLCN and ZERDRCN are coupled to the outputs of the registers 30 and 31, respectively. The zero detector 33 outputs a signal data is zero DZER, when the left channel audio signal LD is zero and the zero detector 34 outputs the signal DZER when the right channel signal RD is zero. In other words the zero detectors 33 and 34 serve to determine points of time when there is silence on the left or right audio channel.

The interface module 23 further has a left channel reset control module LCNRS 35 and a right channel reset control module RCNRS 36.

The control module 35 has a reset controller module RCNT 37 and a down counter module DCD 38. The reset controller module 37 receives the signal DZER from the zero detector 33.

When the signal DZER is not asserted by the zero detector 33, i.e. when the left channel audio data LD is not equal to zero, the reset controller module 37 asserts the signal load down counter LDCO which is inputted into the down counter module 38.

In response the threshold value which is applied to the down counter module 38 by means of signal TRH and is stored in the counter register 39 of the down counter module 38. Further the down counter module 38 receives the signal SL.

When the signal SL is asserted the content of the counter register 39 is decremented. When the content of the counter register 39 reaches zero the timer has expired and the signal counter finished COF is outputted by the down counter module 38 and inputted into the reset controller module 37. In response the reset controller module 37 outputs the signal CL in order to reset the left channel of the noise shaper module 24, cf. FIG. 2.

The internal structure of the reset module 36 for the right channel is the same as the above described internal structure of the control module 35 for the left channel. This way the left and right audio channels of the noise shaper module 24 can be reset independently. This feature is important for audio events which happen only on one channel while there is silence on the other channel.

Figure 4:
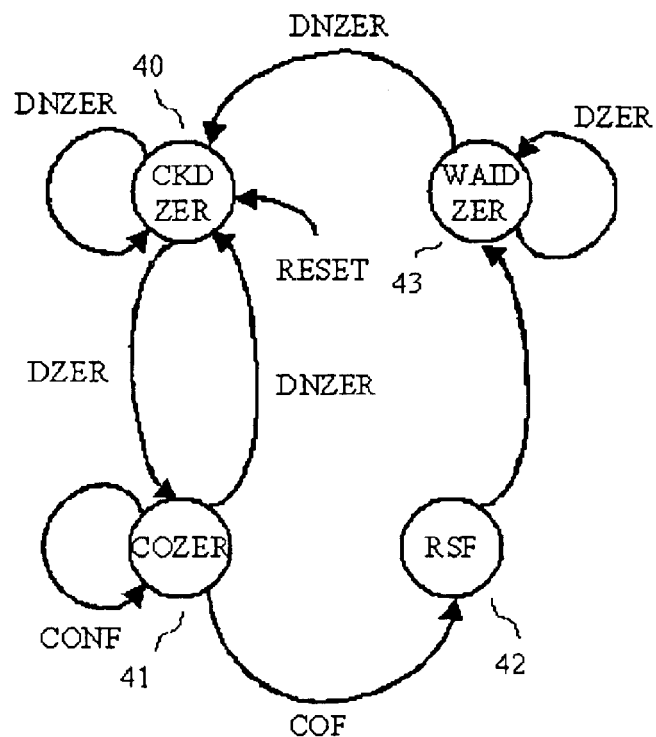
FIG. 4 is a state diagram illustrating the operation of the electronic circuit of FIG. 3.

FIG. 4 shows a state diagram illustrating the operation of the control modules 35 and 36.

Initially the control module is at the state 40. While being in the state 40 it is permanently checked whether the data on the corresponding channel, i.e. the signal LD or respectively the signal RD, is zero. The condition for remaining in the state 40 is that the data is not zero (DNZER).

If data is zero DZER is detected a transition occurs from state 40 to state 41. In state 41 the timer is started and is counted down. The condition for remaining in state 41 is that the counter has not expired CONF. A further condition for remaining in the state 41 is that the data continues to be zero. If the data is not zero DNZER a transition occurs from state 41 back to state 40.

When the timer expires and the data is still zero there is a transition from state 41 to state 42. In state 42 the left or right channel of the noise shaper module is reset. After the reset operation has been performed there is a transition from state 42 to state 43. State 43 is a wait state which is assumed as long as the data is zero DZER. The wait state 43 is left when the data becomes non-zero, i.e. when the silent interval is over. When the condition data is not zero DNZER is fulfilled there is a transition from state 43 back to the initial state 40.

Figure 5:
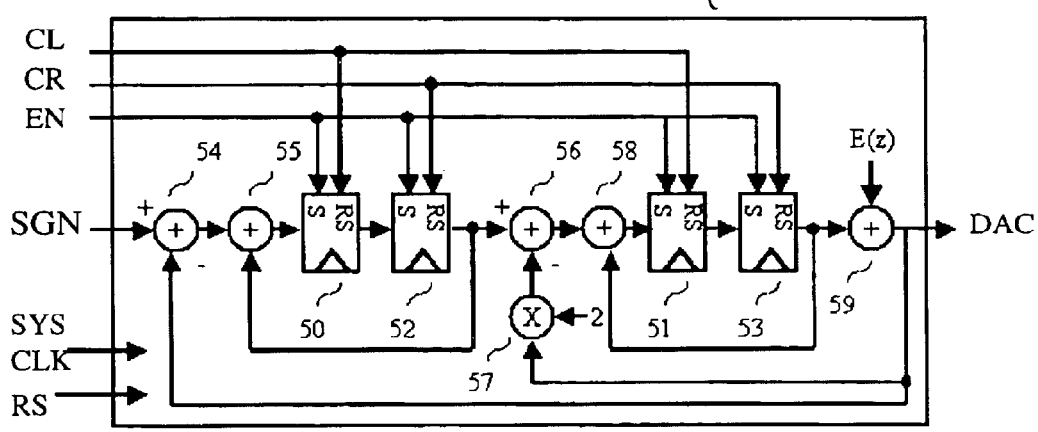
FIG. 5 is a circuit schematic of the noise shaper filter of the Sigma-Delta digital to analogue converter of FIG. 2.

FIG. 5 shows a more detailed circuit diagram of the noise shaper 24 of FIG. 2. The noise shaper 24 has registers 50 and 51 for the left channel and registers 52 and 53 for the right channel. Each of the registers 50 to 53 has a set S and a reset RS input. The enable input S of the register 50 is connected to the signal EN and the reset input RS is connected to the signal CL. The same applies for the register 51.

The set input S of the register 52 is connected to the signal EN and the input RS is connected to the signal CR. The same applies for the register 53.

The noise shaper module 24 contains a number of feedback loops which are realized by means of adders and multipliers. The input signal SGN is inputted into adder 54 where the output signal DAC is subtracted. The differential signal is inputted into adder 55 for adding of the output of the register 52. The resulting output of the adder 55 is inputted into the register 50 and the output of the register 50 is inputted into the register 52.

The output of the register 52 is applied to adder 56 for subtraction of the output of multiplier 57. The output signal DAC is multiplied by a factor of two in the multiplier 57.

The output of adder 56 is applied to adder 58. The other input of the adder 58 is the output of the register 53. The output of the adder 58 is applied to the input of the register 51 and the output of the register 51 is applied to the input of the register 53. The addition of quantization noise at the higher frequency is symbolised by adding the noise signal E(z) to the output signal of the register 53 by means of adder 59 which provides the output signal DAC.

Figure 6:
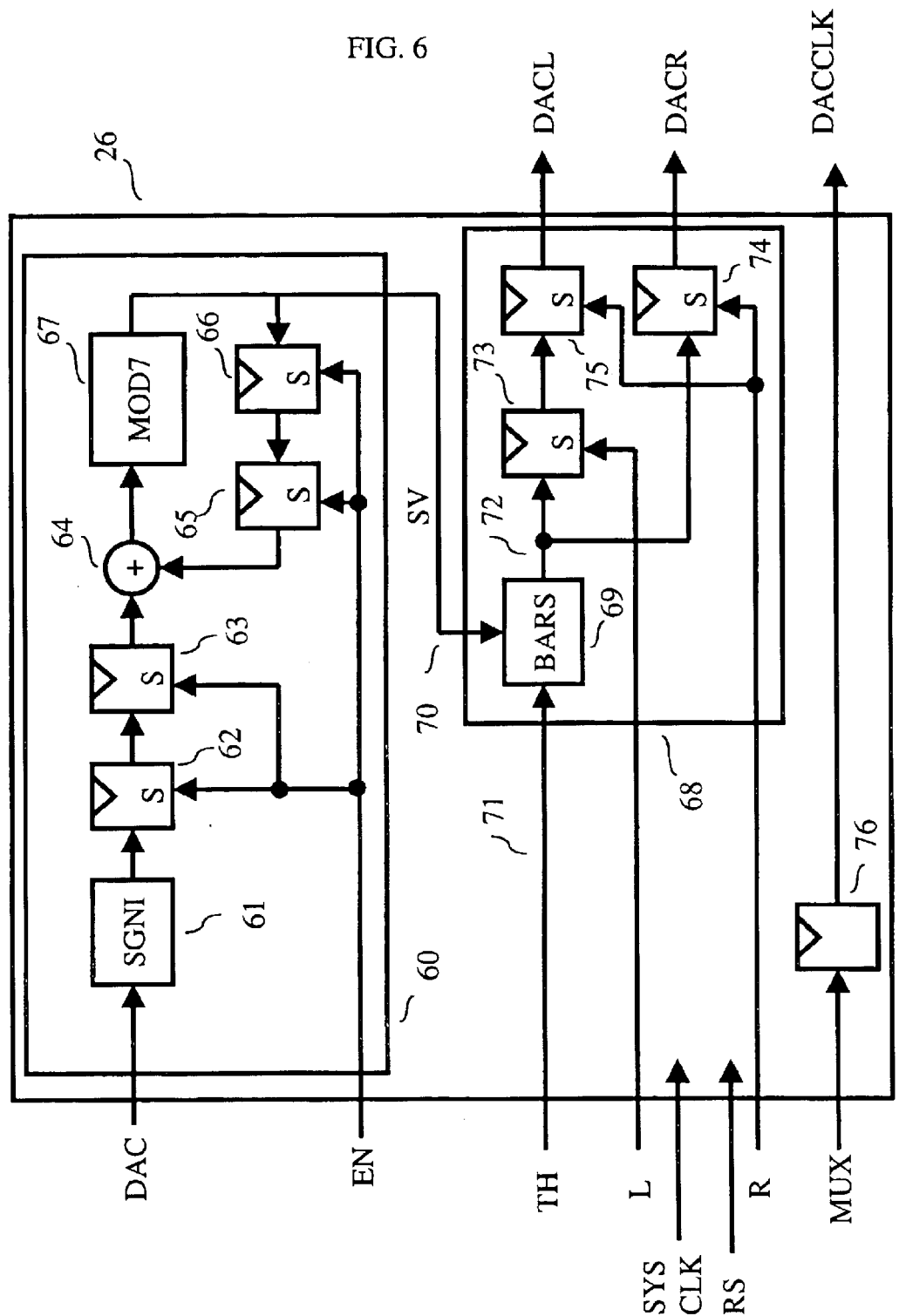
FIG. 6 is a block diagram of a randomiser and a control circuit of the randomiser.

FIG. 6 shows a block diagram of an implementation of the randomiser 26. The randomiser 26 has a control module 60 which corresponds to the control module 6 of the randomiser 5 of FIG. 1.

The control module 60 has a module 61 which serves to convert a 2-complement input signal into an integer number. This way the 2-complement signal DAC is converted into an integer.

The output of the module 61 is coupled to input of register 62 and the output of register 62 is coupled to input of register 63.

The output of register 63 is coupled to adder 64. The other input of adder 64 is coupled to the output of register 65 and the input of register 65 is coupled to the output of register 66.

The output of adder 64 is coupled to the input of module 67 which serves to calculate modulo n of the output of adder 64. In the example considered here the signal DAC has a width of m=3 bits, such that $n=2^m-1=7$.

The enable inputs S of the registers 62, 63, 65 and 66 are coupled to the enable signal EN in order to alternately process left and right channel data.

The randomiser module 26 further has a barrel shifter module 68 which comprises a barrel shifter 69. The barrel shifter has a control input 70 which determines the shifting distance of the barrel shifter 69. The control input 70 of the barrel shifter 69 is coupled to the output signal SV of the module 67.

The barrel shifter 69 has an input 71 which is coupled to the signal TH to be randomised by a barrel shifting operation.

The output 72 of the barrel shifter is coupled to the inputs of the registers end 74. The output of the register 73 is coupled to the input of the register 75.

The enable input S of the register 73 is coupled to the signal L and the enable inputs S of the registers 74 and 75 are coupled to the signal R. At the output of the register 75 the signal DACL is provided and that the output of the register 74 the signal DACR. The randomiser module 26 further has a multiplexer 76 for receiving the signal MUX and for providing the signal DACCLK. Further the randomiser 26 receives the system clock SYSCLK signal.

In operation the signal DAC is inputted into the randomiser 26 and converted to integer in the module 61.

The left and right channel signal components are deinterleaved and modulo 7 of the signals are calculated. In parallel the signal to be randomised which is TH is inputted into the barrel shifter 69 and barrel shifted by a distance which is determined by the result of the modulo 7 calculation. This way randomised output signals DACL and DACR are provided which are used to switch the current sources I0 to I6 of the conversion modules 27 and 28, respectively.

It is to be noted that the randomisation of the signal to be digital to analogue converted in accordance with this preferred embodiment is particularly advantageous as tolerances of the current sources are averaged out and quantization noise which is due to the noise shaper 24 is not transformed into an audible frequency spectrum.

The new structure removes both negative effects: each coefficient is no more incremented by 1 but by the number of active bits in the previous input sample. This implies that the shifting coefficient is now separately determined for each channel. These numbers are obtained from the Noise Shaper output DAC, after conversion from two's complement to integer format, and then stored in two registers.

The number of active clock cycles for each bit of the output samples during one period is now equal for all bits. This means that in general each current source is enabled for the same amount of time and that the effect of mismatches between the implemented currents is reduced.

What is claimed is:

1. A method for converting a digital signal to an analogue signal, the method comprising the steps of:

converting the digital signal to a thermometer coded signal, randomising the thermometer coded signal, controlling the randomisation of the thermometer coded signal by means of the digital signal, converting the randomised signal to the analogue signal.

2. The method of claim 1, whereby the steps of randomising and controlling are performed by barrel shifting the thermometer coded signal and controlling the barrel shifting based on the digital signal.

3. The method of claim 1, whereby the digital signal having a width of m bits and a control signal for the randomisation is derived from the digital signal by determining modulo n of the digital signal, where $n=2^m-1$.

4. A digital to analogue converter comprising:

means for converting a digital signal to a thermometer coded signal, means for randomising the thermometer coded signal, means for controlling the means for randomising based on the digital signal, means for converting the randomised signal to analogue.

5. The digital to analogue converter of claim 4, wherein the means for randomising comprising barrel shifter means having a control input coupled to the means for controlling.

6. The digital to analogue converter of claim 4, wherein the means for controlling having means for determining a modulo n of the digital signal, where $n=2^m-1$, for generating a control signal for the means for randomisation.

7. The digital to analogue converter of claim 6, wherein the means for converting comprising a number of n current sources.

8. The digital to analogue converter of claim 4, further comprises:

noise shaper means, means for controlling the noise shaper means, the means for controlling the noise shaper means being adapted to reset the noise shaper means when a digital input signal remains at a predetermined signal level for a predetermined period of time.

9. The digital to analogue converter of claim 8 further comprising input means for programming the predetermined period of time.

10. An audio device, such as a CD system, DVD system, television system or other digital audio recording, reception or playback system, comprising a digital to analogue converter in accordance with claim 4.

* * * * *